US006329865B1

(12) United States Patent
Hageraats et al.

(10) Patent No.: US 6,329,865 B1
(45) **Date of Patent: *Dec. 11, 2001**

(54) LINEARIZED TRANSCONDUCTANCE CELL

(75) Inventors: Johannes J. E. M. Hageraats, Saratoga; Osama Shana'a, Stanford, both of CA (US)

(73) Assignee: Maxim Integrated Products, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/272,055

(22) Filed: Mar. 18, 1999

(51) Int. Cl.[7] .................................................... H03K 17/92

(52) U.S. Cl. .......................... 327/372; 327/359; 327/103

(58) Field of Search .................................... 330/252, 254; 327/103, 355, 359, 372; 333/167, 172, 175; 332/123; 315/209 R; 331/109

(56) References Cited

U.S. PATENT DOCUMENTS

| | | | | |
|---|---|---|---|---|
| 5,020,146 | * | 5/1991 | Pugel | 455/195 |
| 5,311,088 | | 5/1994 | Nelson | 370/520 |
| 5,373,248 | | 12/1994 | Fernandez | 330/253 |
| 5,416,448 | * | 5/1995 | Wessendorf | 331/116 R |
| 5,444,414 | | 8/1995 | Delano | 327/563 |
| 5,463,348 | | 10/1995 | Sarpeshkar et al. | 330/253 |
| 5,493,250 | | 2/1996 | Kasperkovitz | 327/563 |
| 5,500,623 | | 3/1996 | Kimura | 330/252 |
| 5,578,965 | | 11/1996 | Kimura | 330/254 |
| 5,726,600 | | 3/1998 | Raghavan et al. | 327/553 |
| 5,731,745 | * | 3/1998 | Parham | 332/123 |
| 5,828,265 | | 10/1998 | Mensink et al. | 327/563 |
| 5,884,154 | * | 3/1999 | Sano et al. | 455/333 |
| 6,023,196 | * | 2/2000 | Ashby et al. | 330/290 |
| 6,166,494 | * | 12/2000 | Green | 315/209 |
| 6,229,395 | * | 5/2001 | Kay | 330/252 |

FOREIGN PATENT DOCUMENTS

| | | |
|---|---|---|
| 19708007 | 2/1998 | (DE) . |
| 2462817 | 2/1981 | (FR) . |

* cited by examiner

*Primary Examiner*—Tuan T. Lam
*Assistant Examiner*—Hiep Nguyen
(74) *Attorney, Agent, or Firm*—Fish & Richardson P.C.

(57) ABSTRACT

A transconductance cell has first and second transistors, each transistor having a control terminal and first and second terminals. A signal is output from the second transistor in response to a voltage input applied to the control terminal of the first transistor. The transconductance cell includes a linear element coupled between the first terminal of the first transistor and the first terminal of the second transistor. A tank circuit is coupled between a reference potential and a node between the linear element and the first terminal of the second transistor.

18 Claims, 4 Drawing Sheets

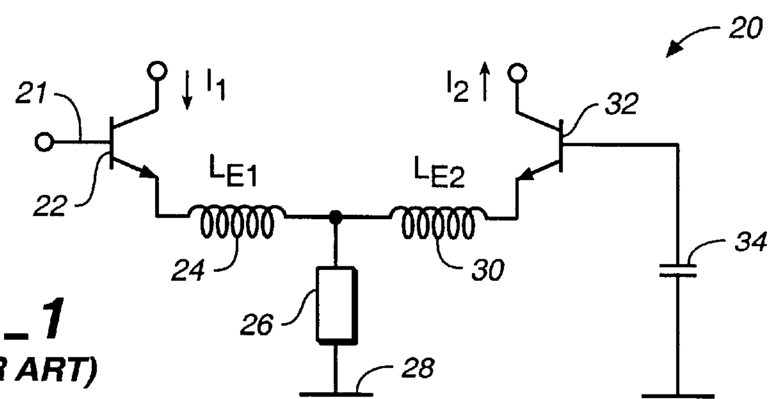
FIG._1
(PRIOR ART)
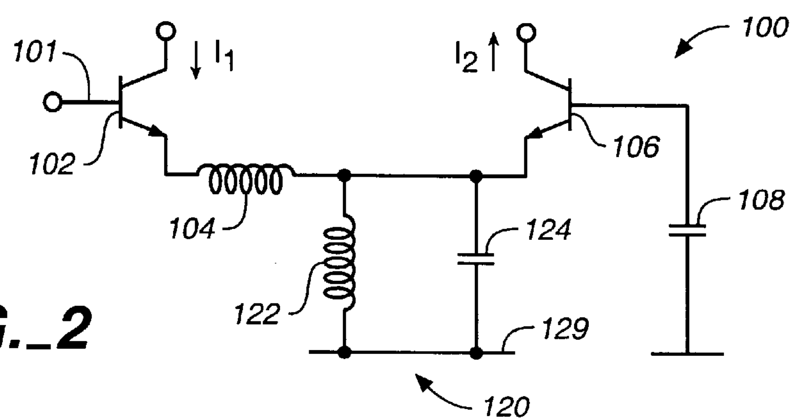
FIG._2
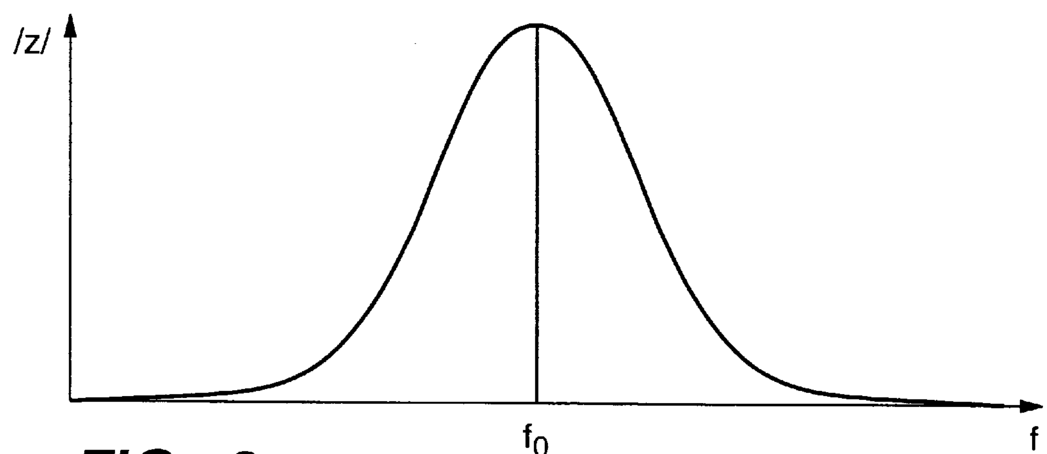
FIG._3

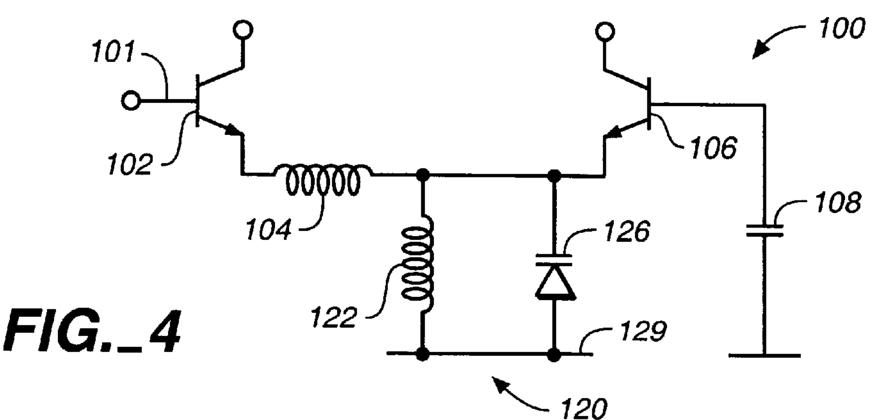
FIG._4
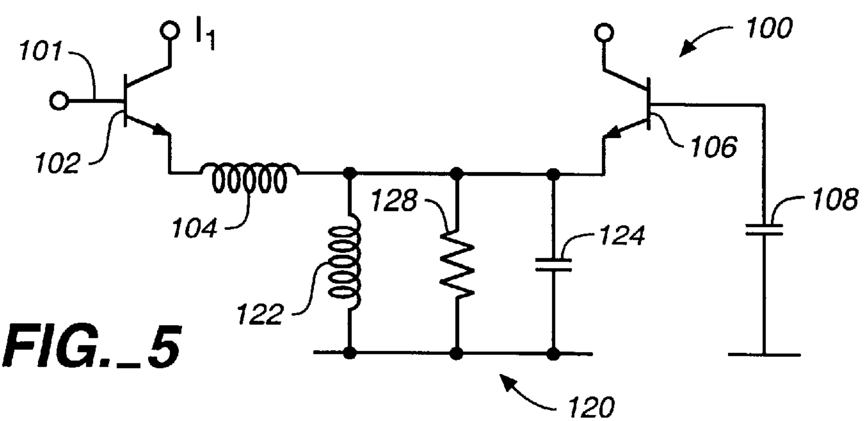
FIG._5
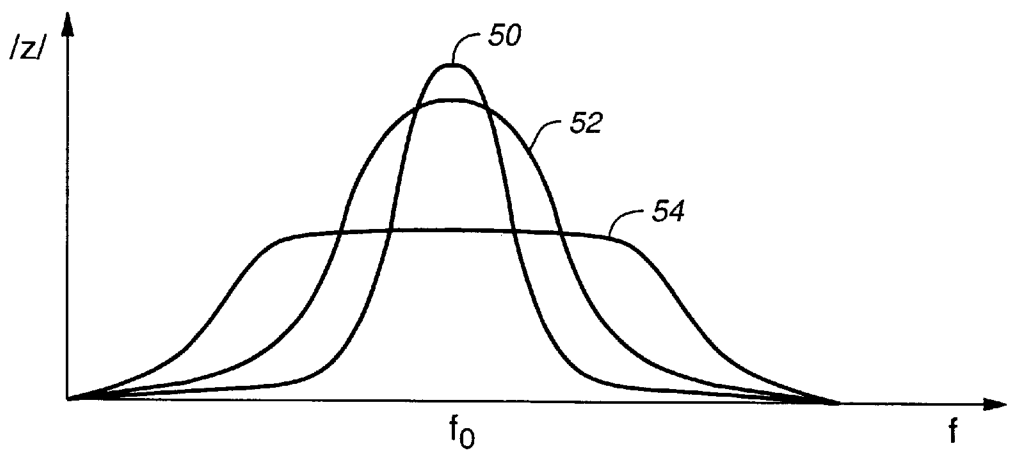
FIG._6

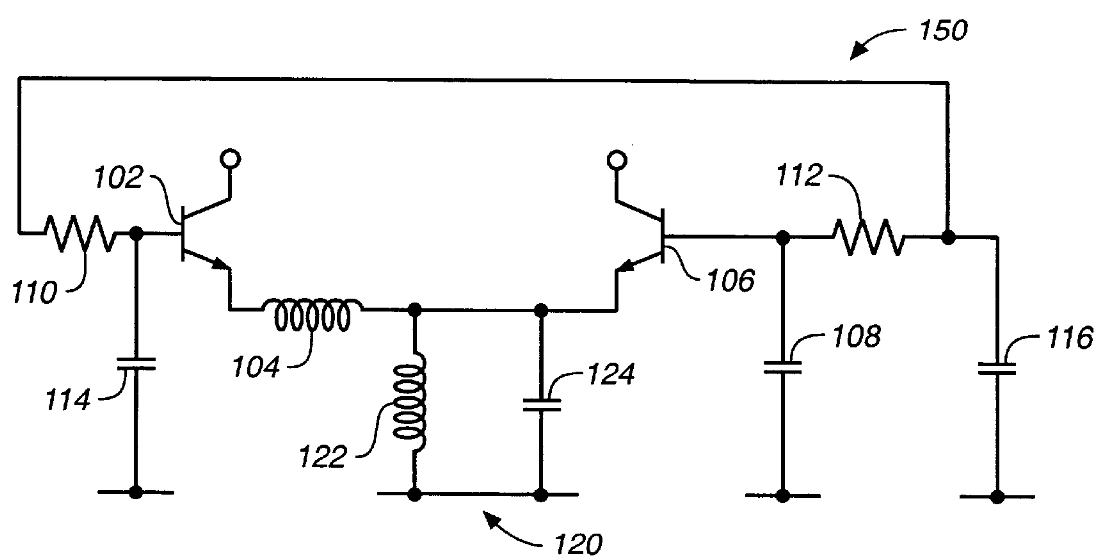
FIG._7

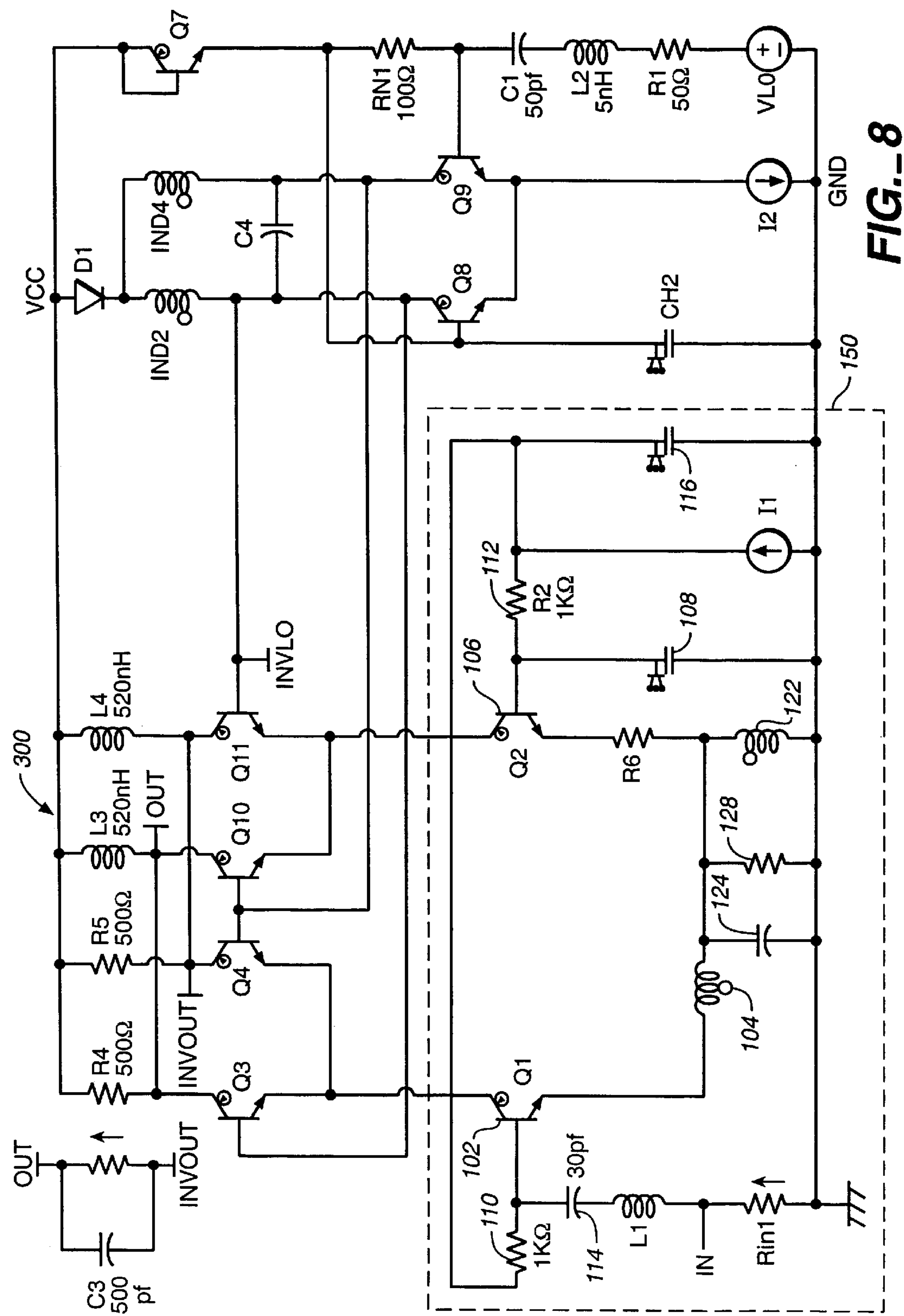
FIG._8

LINEARIZED TRANSCONDUCTANCE CELL

BACKGROUND OF THE INVENTION

The present invention relates to transconductance cells, in particular, to linearized transconductance cells for use in electronic circuits.

A transconductance cell is an electronic building block used to build more complex electronic circuits. It is widely used in RF circuits such as low noise amplifiers and Gilbert cell mixers.

The transconductance cell performs the function of converting a voltage input into a current output. The characteristics of a desirable transconductance cell are high bandwidth, low noise, low power consumption, high output impedance, low distortion and good common mode rejection.

FIG. 1 shows a schematic diagram of a prior art transconductance cell 20. Other parts of the RF circuit (e.g., the Gilbert cell mixer) to which the transconductance cell 20 is connected are not shown. The prior art transconductance cell 20 for RF applications includes a first bipolar transistor 22, a second bipolar transistor 32, a first inductor 24, a second inductor 30, a resistor 26 and a capacitor 34. A voltage input 21 is coupled to the base of the first transistor 22. The collector of the first transistor 22 is coupled to another part of the circuit. The emitter of the first transistor 22 is coupled to one end of the first inductor 24. The opposing end of the first inductor 24 is coupled to one end of the second inductor 30. One end of the resistor 26 is coupled to a node between the first and second inductors 24 and 30. The other end of the resistor 26 is coupled to a node 28 which may be a ground.

The opposing end of the second inductor 30 is coupled to the emitter of the second transistor 32. The collector of the second transistor is coupled to another part of the circuit. The base of the second transistor 32 is coupled to the capacitor 34 and is biased at a constant voltage.

In operation, a bias voltage is applied to the transconductance cell 20 at the bases and the collectors of the first and second transistors 22 and 32 to bias the first and second transistors 22 and 32 for operation. In response to the bias voltage, DC currents flow through the first and second transistors 22 and 32 and exit through the resistor 26. The bias voltage typically ranges between 2.7 volts and 5.5 volts for RF circuits. Much of the bias voltage is dropped across the resistor 26 which is designed to have high impedance, as explained below. The resistor 26 also can be implemented as a transistor which also cause a voltage drop.

Once the bias voltage has been applied, the voltage input 21 is applied to the base of the first transistor 22 to output a signal from the emitter of the first transistor 22. The signal travels through the first and second inductors 24 and 30 and is output from the collector of the second transistor 32 to another part of the circuit. The signal output by the first transistor 22 may be directed from the first inductor 24 to the second inductor 30 without significant signal dissipation through the resistor 26 by using a resistor that has a high impedance value as the resistor 26.

One problem associated with the prior art transconductance cell 20 is that this requisite high impedance of the resistor 26 makes it difficult to operate the circuit at a low voltage.

Another problem associated the prior art transconductance cell 20 that the noise factor (NF) and the third-order input intercept point (IIP3) are degraded due to signal loss in the resistor 26. The noise contribution of the resistor 26 lowers the NF as well.

SUMMARY OF THE INVENTION

In one aspect, the invention features a linearized transconductance cell. The invention includes a first transistor having a control terminal and first and second terminals; a second transistor having a control terminal and first and second terminals, wherein a signal is output from the second terminal of the second transistor in response to an input voltage applied to the control terminal of the first transistor; a linear element coupled between the first terminal of the first transistor and the first terminal of the second transistor; and a tank circuit coupled between a reference voltage and a node between the linear element and the first terminal of the second transistor.

In another aspect, the invention features an electronic circuit including a transconductance cell. The transconductance cell includes a first transistor having a control terminal and first and second terminals; a second transistor having a control terminal and first and second terminals, wherein a signal is output from the second terminal of the second transistor in response to an input voltage applied to the control terminal of the first transistor; a linear element having first and second ends coupled between the first terminal of the first transistor and the first terminal of the second transistor; and a tank circuit having a first end coupled to a reference voltage and a second end coupled to a node between the linear element and the first terminal of the second transistor.

In another aspect, the invention features a transconductance cell having a single-ended input. The invention includes a first transistor having a control terminal and first and second terminals; a second transistor having a control terminal and first and second terminals, wherein a current flows between the first and second terminals of the second transistor in response to an input voltage applied to the control terminal of the first transistor; a first linear element having first and second ends, the first end coupled to the first terminal of the first transistor; a second linear element having first and second ends coupled between the second end of the first linear element and the first terminal of the second transistor; and a tank circuit coupled between a reference voltage and a node between the first and second linear elements.

In another aspect, the invention features a transconductance cell having a single-ended input; a first transistor having a control terminal and first and second terminals; a second transistor having a control terminal and first and second terminals, where a current flows between the first and second terminals of the second transistor in response to an input voltage applied to the control terminal of the first transistor; a linear element having first and second ends coupled between the first terminal of the first transistor and the first terminal of the second transistor; and an inductor coupled between a reference voltage and a node between the linear element and the first terminal of the second transistor.

Among the advantages of the invention are that the invention: (1) virtually eliminates consumption of the bias voltage and significantly improves the headroom; (2) significantly improves the noise factor (NF) since an inductor, a noiseless device, is used rather than a resistor; (3) significantly improves the third-order input intercept point (IIP3) when compared to a standard differential pair; and (4) allows for the tuned transfer characteristic.

For fuller understanding of the nature and further advantages of the invention, reference should be made to the detailed description taken in conjunction with the accompanying drawings.

BRIEF DESCRIPTION OF THE DRAWING

FIG. 1 shows a schematic diagram of a prior art transconductance cell 20.

FIG. 2 shows a schematic diagram of a linearized transconductance cell 100 in accordance with the invention.

FIG. 3 shows a frequency response curve of a tank circuit of the invention which includes an inductor and a capacitor.

FIG. 4 shows a transconductance cell of the invention having a tank circuit which includes an inductor and a varactor diode.

FIG. 5 shows a transconductance cell of the invention having a tank circuit which includes an inductor, a capacitor and a resistor.

FIG. 6 shows frequency response curves of a tank circuit of the invention as the resistance of a resistor is varied.

FIG. 7 shows a linearizing resistor coupled to a base of each of the two transistors in a transconductance cell of the invention.

FIG. 8 shows a Gilbert cell mixer using a transconductance cell according to the invention.

DESCRIPTION OF THE PREFERRED EMBODIMENTS

FIG. 2 shows a schematic diagram of a linearized transconductance cell 100 in accordance with the present invention. Other parts of the circuit (e.g., Gilbert cell mixer) to which the transconductance cell 100 is connected are not shown. The transconductance cell 100 includes a first transistor 102, a second transistor 106, a linear element, such as an inductor 104, a tank circuit 120, and a first capacitor 108. Although the first and second transistors 102 and 106 may be field effect transistors, they are illustrated as bipolar transistors for purposes of the discussion herein. Similarly, although the linear element 104 may be a resistor or other form of linear device, the preferred embodiment is an inductor and referred to as "a first inductor 104" for discussion herein.

A voltage input 101 is coupled to the base of the first transistor 102 and controls the output signal on the collector of the second transistor 106. The collector of the first transistor 102 is coupled to another part of the circuit. The emitter of the first transistor 102 is coupled to one end of the first inductor 104. The opposing end of the first inductor 104 is coupled to the emitter of the second transistor 106. The first inductor 104 is used to improve the linearity of the first and second transistors 102 and 106. The collector of the second transistor 106 is coupled to another part of the circuit. The base of the second transistor 106 is coupled to the first capacitor 108 and is biased at a constant voltage. Therefore, the signal output from the collector of the second transistor 106 is determined solely by the voltage input 101 applied to the base of the first transistor 102.

One end of the tank circuit 120 is coupled to a node between the first inductor 104 and the emitter of the second transistor 106. The opposing end of the tank circuit 120 is coupled to a node 129 which may be a ground. The tank circuit 120 generally includes an inductor (i.e., a second inductor 122) and a capacitor (i.e., a second capacitor 124) coupled in parallel. Other forms of the tank circuit 120 will be discussed later.

In operation, a bias voltage is applied to the transconductance cell 100 at the bases and the collectors of the first and second transistors 102 and 106 to bias the first and second transistors 102 and 106 for operation. In response to this bias voltage, DC currents flow through the first and second transistors 102 and 106 and exit through the first inductor 122. Since an inductor behaves like a short circuit to a DC current, the bias voltage does not experience any voltage drop across the first inductor 122. This enables the transconductance cell 100 to be operated at a relatively low voltage and also increases the headroom for the circuit.

Once the bias voltage has been applied at the bases and collectors of the first and second transistors 102 and 106, the voltage input 101 is applied to the base of the first transistor 102 to output a signal at the emitter of the first transistor 102. The signal flows through the first inductor 104 and is received at the emitter of the second transistor 106. The signal is output from the collector of the second transistor 106 to another part of the circuit.

The signal output by the first transistor 102 may be directed to the second transistor 106 without significant signal dissipation through the tank circuit 120 by appropriately choosing the inductance value of the second inductor 122 and the capacitance value of the second capacitor 124, as explained below. The tank circuit 120 may be seen as a band-pass filter. The frequency response curve of the tank circuit 120 is shown in FIG. 3. The resonant frequency $f_o$ of the tank circuit is determined by the equation:

$$f_o = \frac{1}{\sqrt{LC}}$$

where L is the inductance of the second inductor 122 of the tank circuit 120 and C is the capacitance of the second capacitor 124 of the tank circuit 120.

The gain, output over input, of the tank circuit 120 is greatest at the resonant frequency $f_o$. That is, a signal having the resonant frequency flows from the first inductor 104 to the emitter of the second transistor 106 without experiencing significant signal dissipation through the tank circuit 120, which is placed between the first inductor 104 and the emitter of the second transistor 106. The tank circuit 120 with appropriately selected inductance L and capacitance C would, therefore, behave as a resistor having a high impedance value against a signal having the resonant frequency.

FIG. 4 shows the transconductance cell 100 having the tank circuit 120 which includes a second inductor 122 and a varactor diode 126. The varactor diode acts as a capacitor whose capacitance changes according to an input voltage across it. The tank circuit 120 of FIG. 4 allows for tunable response to changes in the frequency of the signal across the varactor diode. For example, if the signal frequency is lowered, then the capacitance of the varactor diode 126 may be increased by adjusting the input voltage across the varactor diode 126.

FIG. 5 shows the transconductance cell 100 having a tank circuit 120 which includes a second inductor 122, a second capacitor 124 and a resistor 128. The transconductance cell 100 of FIG. 5 may be used for broadband applications, such as TV tuners, which generally operates at a bandwidth greater than 100 MHz.

The bandwidth of a frequency response curve derived from the tank circuit 120 depends upon the total resistance across the tank circuit 120. Since there are no perfect conductors, inductors inherently have some resistive value. Inductors generally have a very low resistance so the bandwidth of the frequency response of the tank circuit 120 of FIG. 2, having only one inductor and one capacitor tends to be narrow, for example, about 200 MHz or less. Such a narrow bandwidth is appropriate for narrow bandwidth applications such as cellular phones or cordless telephones. However, such tank circuits are not appropriate for broadband applications. The transconductance cell 100 of FIG. 2 may be adopted for broadband applications by coupling a resistor, such as the resistor 128 shown in FIG. 5, in parallel with the second inductor 122 and the second capacitor 124. The resistance of the resistor 128 may be selected according to the desired bandwidth.

FIG. 6 shows frequency response curves 50, 52 and 54 as the resistance of the resistor 128 in FIG. 5 is progressively increased. The frequency response curve 50 illustrates the use of a resistor 128 having the lowest resistance of the three, and the frequency response curve 54 is for a resistor 128 having the highest resistance.

FIG. 7 shows a schematic diagram of a linearized transconductance cell 150 according to another embodiment of the present invention. The circuit arrangement of the transconductance cell 150 is substantially similar to that of the transconductance cell 100 shown in FIG. 2. The transconductance cell 150 additionally includes first and second linearizing resistors 110 and 112 and capacitors 114 and 116.

One end of the first linearizing resistor 110 is coupled to the base of the first transistor 102. The opposing end of the first linearizing resistor 110 is coupled to one end of the capacitor 116. The opposing end of the capacitor 116 is coupled to a node which may be a ground. The collector of the first transistor 102 is coupled to another part of the circuit. The emitter of the first transistor 102 is coupled to one end of the first inductor 104. The opposing end of the first inductor 104 is coupled to the emitter of the second transistor 106. The collector of the second transistor 106 is coupled to another part of the circuit. The base of the second transistor 106 is coupled to one end of the first capacitor 108 and one end of the second linearizing resistor 112. The opposing end of the first capacitor 108 is coupled to a node which may be a ground. The opposing end of the second linearizing resistor 112 is coupled to a node between the first linearizing resistor 110 and the capacitor 116. One end of the capacitor 114 is coupled to a node between the first linearizing resistor 110 and the base of the first transistor 102. The opposing end of the capacitor 114 is coupled to a node which may be a ground.

One end of the tank circuit 120 is coupled to a node between the first inductor 104 and the emitter of the second transistor 106. The opposing end of the tank circuit 120 is coupled to a node which may be a ground. The tank circuit 120 includes a second inductor 122 and a second capacitor 124 coupled in parallel.

The resistive values of the first and second linearizing resistors 110 and 112 may be selected to improve the linearity of the transconductance cell 150. Generally, if the resistive value of the linearizing resistor 110 or 112 is decreased, the linearity of the transconductance cell 150 improves. However, such improvement in linearity is obtained at the cost of less gain and more noise.

Various forms of the transconductance cells described above may be used in any number of electronic circuits. One common use for the transconductance cell is in a Gilbert cell mixer. FIG. 8 shows a Gilbert cell mixer 300 using the transconductance cell 150 shown in FIG. 7. Alternatively, the Gilbert cell 300 may use the transconductance cell 100 shown in FIGS. 2, 4 and 5.

The present invention has been described in terms of a preferred embodiment. The invention, however, is not limited to the embodiment depicted and described. Rather, the scope of the invention is defined by the appended claims.

What is claimed is:

1. A linearized transconductance cell, comprising:

a first transistor having a control terminal for receiving an input signal and first and second terminals;

a second transistor having a control terminal for receiving a bias voltage and first and second terminals, wherein a signal is output from the second terminal of the second transistor in response to an input voltage applied to the control terminal of the first transistor;

a linear element having first and second ends, wherein the first end is directly coupled to the first terminal of the first transistor and the second end is directly coupled to the first terminal of the second transistor; and a tank circuit having first and second ends, wherein the first end is coupled directly to ground and the second end is coupled directly to the first terminal of the second transistor.

2. The transconductance cell of claim 1, wherein the tank circuit includes an inductor directly coupled between ground and the first terminal of the second transistor.

3. The transconductance cell of claim 2, wherein the tank circuit further includes a capacitor coupled in parallel across the inductor.

4. The transconductance cell of claim 2, wherein the tank circuit further includes a varactor diode coupled in parallel across the inductor.

5. The transconductance cell of claim 2, wherein the tank circuit further includes a resistor coupled in parallel across the inductor.

6. The transconductance cell of claim 1, wherein the linear element is an inductor.

7. The transconductance cell of claim 1, further comprising a first linearizing resistor coupled to the control terminal of the first transistor.

8. The transconductance cell of claim 1, further comprising a second linearizing resistor coupled to the control terminal of the second transistor.

9. The transconductance cell of claim 1, wherein the first and second transistors are bipolar transistors.

10. The transconductance cell of claim 1, wherein the first and second transistors are field effect transistors.

11. An electronic circuit including a transconductance cell, the transconductance cell comprising:

a first transistor having a control terminal for receiving an input signal and first and second terminals;

a second transistor having a control terminal for receiving a bias voltage and first and second terminals, wherein a signal is output from the second terminal of the second transistor in response to an input voltage applied to the control terminal of the first transistor;

a linear element having first and second ends, wherein the first end is directly coupled to the first terminal of the first transistor and the second end is directly coupled to the first terminal of the second transistor; and a tank circuit having first and second ends, wherein the first end is coupled directly to ground and the second end is coupled directly to the first terminal of the second transistor.

12. The electronic circuit of claim 11, wherein the transconductance cell's tank circuit includes an inductor having a first end directly coupled to ground and a second end directly coupled to the first terminal of the second transistor.

13. The transconductance cell of claim 12, wherein the tank circuit further includes a capacitor coupled in parallel across the inductor.

14. The transconductance cell of claim 12, wherein the tank circuit further includes a varactor diode coupled in parallel across the inductor.

15. The transconductance cell of claim 12, wherein the tank circuit further includes a resistor coupled in parallel across the inductor.

16. The transconductance cell of claim 11, wherein the first and second transistors are bipolar transistors.

17. The transconductance cell of claim 11, wherein the first and second transistors are field effect transistors.

18. The transconductance cell of claim 11, wherein the linear element is an inductor.

* * * * *